United States Patent [19]
Moon

[11] Patent Number: 6,126,060
[45] Date of Patent: Oct. 3, 2000

[54] SOLDERING DEVICE

[75] Inventor: Young-Zoon Moon, Suwon, Rep. of Korea

[73] Assignee: Samsung Electronics Co., Ltd., Suwon, Rep. of Korea

[21] Appl. No.: 09/238,494

[22] Filed: Jan. 27, 1999

[30] Foreign Application Priority Data

Jul. 3, 1998 [KR] Rep. of Korea ............ 98-26878

[51] Int. Cl.$^7$ ............ B23K 01/08; B23K 31/00; B23K 31/02
[52] U.S. Cl. ............ 228/36; 228/180.21
[58] Field of Search ............ 228/180.1, 36, 228/37, 180.21

[56] References Cited

U.S. PATENT DOCUMENTS

| | | | |
|---|---|---|---|
| 3,941,088 | 3/1976 | Ronafoldi et al. | 118/620 |
| 4,162,034 | 7/1979 | Pavlas | 228/37 |
| 4,555,054 | 11/1985 | Winter et al. | 228/148 |
| 4,684,054 | 8/1987 | Iwasa et al. | 228/180.1 |
| 4,802,617 | 2/1989 | Deambrosio | 228/180.1 |
| 4,921,156 | 5/1990 | Hohnerlein | 228/37 |
| 5,370,297 | 12/1994 | Ciniglio et al. | 228/40 |

FOREIGN PATENT DOCUMENTS 3-27868  2/1991  Japan.

*Primary Examiner*—Patrick Ryan
*Assistant Examiner*—C. Newsome
*Attorney, Agent, or Firm*—Burns, Doane, Swecker & Mathis, L.L.P.

[57] ABSTRACT

A soldering device adaptable to dipping method for preventing neighboring leads (L) from being mixed in molten lead (Pb) even though spaces between leads (L) of parts mounted to a PCB substrate (P) are relatively narrow, the device having a lead tub where molten lead is filled up to an upper end thereof and maintained at a predetermined temperature, the device comprising a receiving plate disposed at an upper surface of the lead tub and formed with a receiving unit for soldered parts of PCB substrate to contact the molten lead, a fixing unit mounted at the receiving plate for the PCB substrate to be accommodated with, detached from and fixed to the receiving unit, and an elevation arranged to elevate the receiving plate horizontally and slantingly.

6 Claims, 4 Drawing Sheets

SOLDERING DEVICE

BACKGROUND OF THE INVENTION

1. Field of the Invention

The present invention relates to a soldering device, and more particularly to a soldering device adapted to be used in a soldering device by dipping method.

2. Description of the Prior Art

Generally, surface mounted device is used for mounting parts to printed circuit board (PCB) and the like. In the surface mounted device, parts with leads and chips are inserted into a PCB substrate, and respective parts are fixed in the PCB substrate by a soldering device. In this case, a soldering device by way of dipping method is commonly used.

One example of soldering device by way of dipping method, as illustrated in FIG. 6, includes a lead tub 50 for storing molten lead (Pb), a cover 52 constructed and arranged to cover an upper surface of the lead tub 50 formed with a plurality of holes 51, and an auxiliary lead tub 55 communicating with a connecting pipe 54 for the molten lead (Pb) in the lead tub 50 to be drawn out therefrom and supplied through a pump 53.

Here, the PCB substrate (P) is arranged to stay on an upper surface of the cover 52 and the holes are spaced out to allow each lead (L) of parts mounted on the PCB substrate to be accurately inserted into the plurality of holes 51.

In other words, when the molten lead (Pb) is supplied to the lead tub 50 and the auxiliary lead tub 55 through the pump 53, the molten lead (Pb) in the lead tub 50 is raised in surface height thereof to thereby solder the lead (L) through the holes 51.

Now, operational process of the soldering device thus constructed will be described.

The PCB substrate (P) is positioned on the upper surface of the cover 52, where the cover 52 formed with the holes 51 is coupled to an upper surface of the lead tub 50 so that parts can be appropriately located on the PCB substrate (P). When the PCB substrate (P) is positioned, the lead (L) of the parts is inserted into the holes 51, at which time, the molten lead (Pb) in the lead tub 50 moves into the auxiliary lead tub 55 through the pump 53 in as much as a predetermined amount.

When the PCB substrate (P) is positioned and the molten lead (Pb) in the auxiliary lead tub 55 is supplied into the lead tub 50 in as much as the predetermined amount according to operation of the pump 53, the surface of the molten lead (Pb) is raised up to a predetermined height. The surface of the molten lead (Pb) reaches the predetermined height, touching the lead (L) through the holes 51. The PCB substrate (P) and lead (L) of the parts are soldered by the contact between the lead (L) and the molten lead (Pb).

However, there is a problem in that neighboring leads (L) are electrically connected by the lead (Pb) according to surface tension and coagulative force of the molten lead (Pb) when spaces (D) between leads (L) of the parts are narrow as illustrated in FIG. 7, thereby resulting in inferior soldering.

In other words, there is a problem in that inferior soldering of PCB substrate occurs when a plurality of leads (L) are covered by a lump of lead (Pb).

SUMMARY OF THE INVENTION

Accordingly, the present invention is disclosed to solve the aforementioned problem and it is an object of the present invention to provide a soldering device constructed and arranged to prevent neighboring leads from being electrically connected thereamong, resulting in inferior PCB substrate when the neighboring leads are soldered with molten lead, even though spaces between leads of parts mounted on the PCB substrate are relatively narrow.

In accordance with the object of the present invention, there is provided a soldering device employing a lead tub constructed and arranged to enable a soldering of a PCB substrate by filling in molten lead of the lead tub up to a hole of a cover and to maintain the molten lead to a predetermined level, the soldering device comprising:

a receiving plate formed with a receiving unit for being accommodated at an upper surface of a cover of the lead tub and for being contacted with the molten lead where the PCB substrate is accommodated, and formed with coupling means disposed at both sides of the receiving unit to intermittently fix the PCB substrate; and elevating means arranged at both sides of the lead tub in order to elevate the receiving plate horizontally and slantingly.

BRIEF DESCRIPTION OF THE DRAWINGS

For fuller understanding of the nature and objects of the invention, reference should be made to the following detailed description taken in conjunction with the accompanying drawings in which.

DETAILED DESCRIPTION OF THE INVENTION

Figure 1:
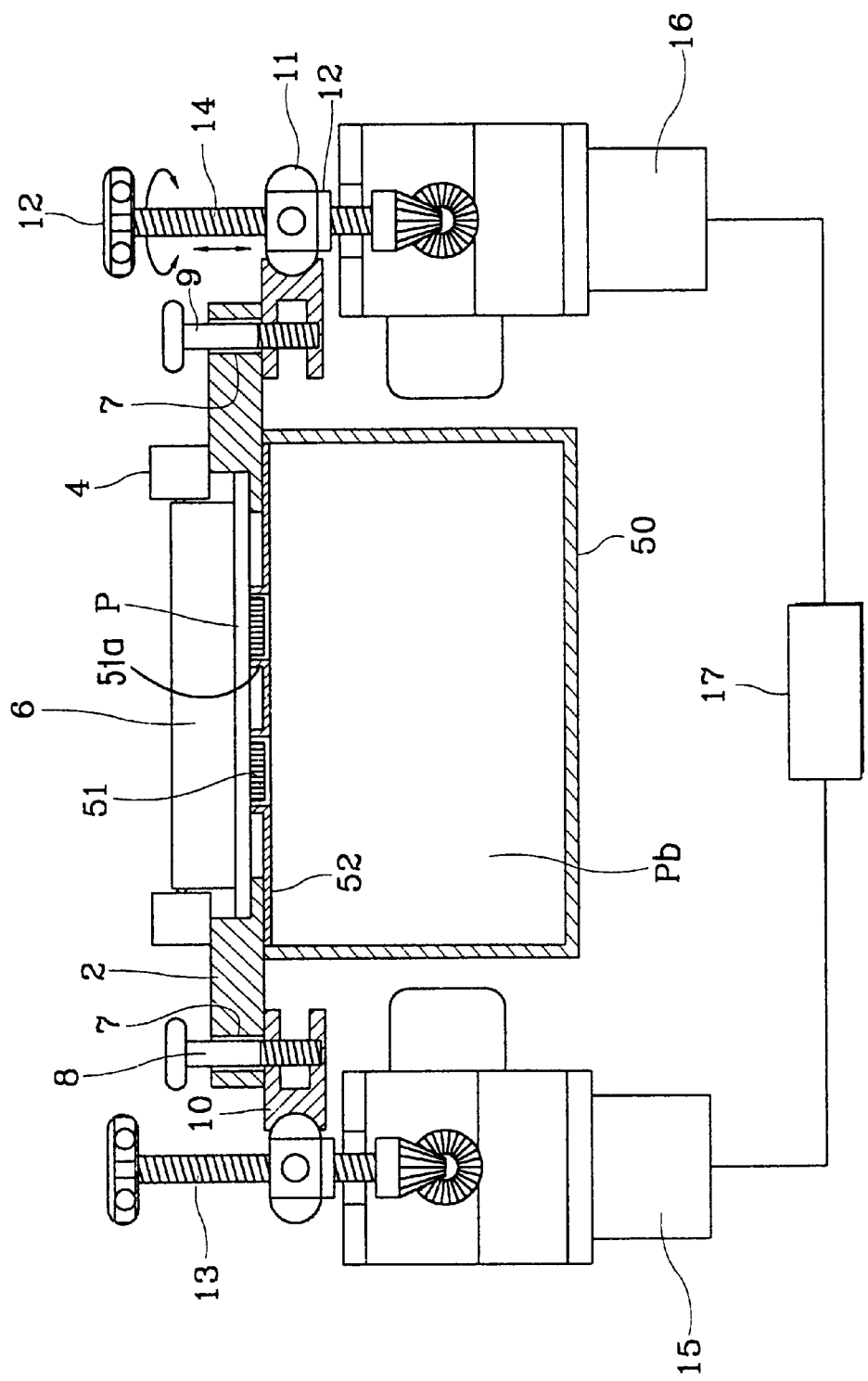
FIG. 1 is a plan for illustrating a soldering device according to the present invention.

FIG. 1 is a plan for illustrating a soldering device according to the present invention, where the soldering device includes a lead tub 50 filled with molten lead (Pb) up to a predetermined level to enable a soldering of a PCB substrate (P) according to the molten lead (Pb) filled in a hole 51 at a cover 52 to a predetermined level, a receiving plate 2 accommodated at an upper surface of the cover 52 in the lead tub 50, fixing means formed at the receiving plate 2 for accommodation and extraction of the PCB substrate (P), and fixation thereof and elevating means disposed at both side of the receiving plate 2 to horizontally and slantingly elevate the receiving plate 2.

In other words, the soldering device according to the present invention is constructed and arranged such that the molten lead (Pb) in the lead tub 50 is set to maintain a constant level, where the PCB substrate (P) is horizontally or slantingly elevated to perform the soldering.

Particularly, the molten lead (Pb) filled in the hole 51 is arranged to maintain a higher level than that of the cover 52, such that soldering occurs only in the hole 51.

Figure 2:
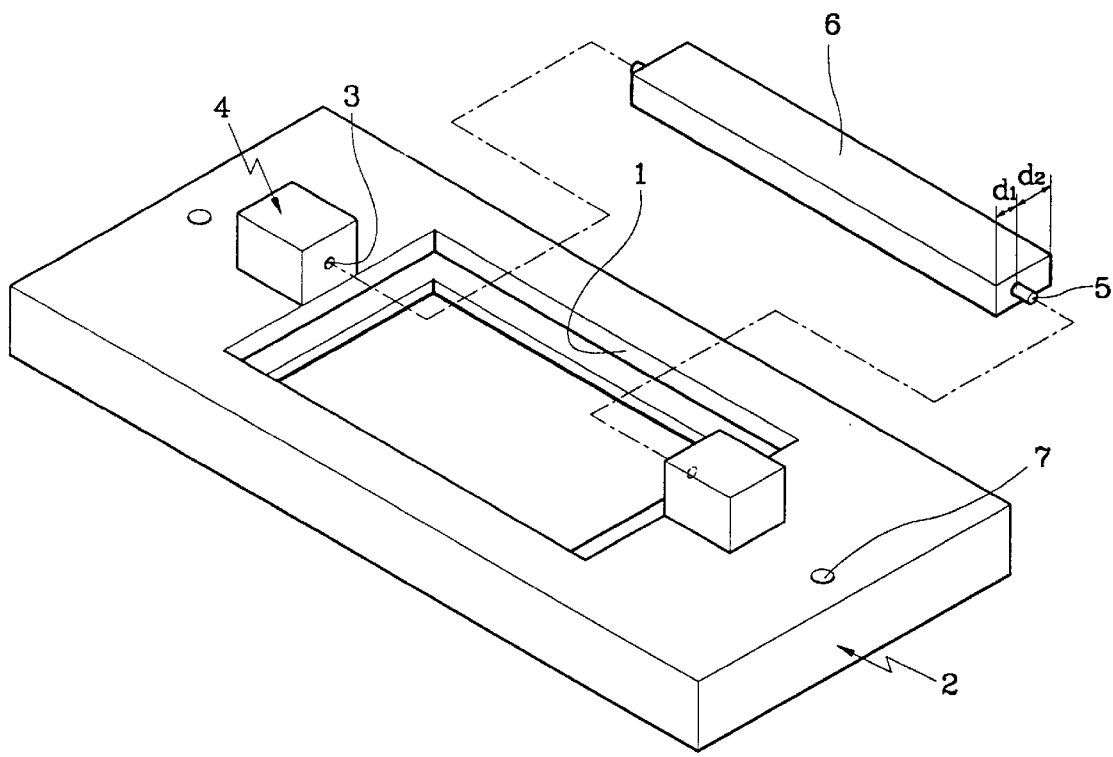
FIG. 2 is an exploded perspective view for illustrating an assembled state of a receiving plate and a pressing jig in FIG. 1.

The fixing means is disposed, as illustrated in FIG. 2, with hinges 4 formed at both sides of the receiving unit 1 and mounted with opposing rotary holes 3, and a pressing jig 6 formed with a rotary shaft 5 at both sides thereof for rotation in the rotary holes 3. The rotary shaft 5 is not centrally positioned at the sides of the pressing jig 6 but is formed at a little bit biased location at each side thereof. Namely, length of d1 and length of d2 are different.

In other words, the pressing jig 6 is biasedly supported in the hinges 4, such that the PCB substrate (P) is compressed during a long-distanced (d2) rotation of the pressing jig 6, but not compressed during a short-distanced (d1) rotation of the pressing jig 6.

The elevating means includes elevation holes 7, each hole being formed at opposite side of the receiving plate 2, first and second elevation rods 8 and 9 inserted into the elevation holes for elevation and each formed with smaller minor diameter than that of the elevation hole and each spaced at a predetermined distance, first and second elevation members 10 and 11 fixed at one side of the first and second elevation roads 8 and 9 and supporting the receiving plate 2 from the bottom thereof, and driving means disposed to vertically move the first and second elevation members.

The purpose of maintaining a predetermined space between the first and second elevation rods 8 and 9 and the elevation hole 7 at the receiving plate 2 and of causing same to protrude above the receiving plate 2 is to allow the receiving plate 2 to slant.

The driving means is disposed with first and second ball screws 13 and 14 screwed to the first and second elevation members 10 and 11 and having both ends thereof supported by rotating support 12 for rotating movement, and transfer means for transferring power of first and second motors 15 and 16 to thereby rotate the first and second ball screws 13 and 14.

Although a predetermined effect can be obtained by directly coupling the first and second ball screws 13 and 14 to rotary shaft of the first and second motors 15 and 16, coupling through the transfer means can achieve further adequate control on directions of the shaft and rotating speed.

Of course, the first and second motors 15 and 16 includes decelerating means (not shown) and are controlled by a control unit 17 such as a microcomputer in rotating frequency and directions thereof, such that the PCB substrate (P) and molten lead (Pb) at the receiving plate 2 can be separated with an optimal angle maintained.

Figure 3:
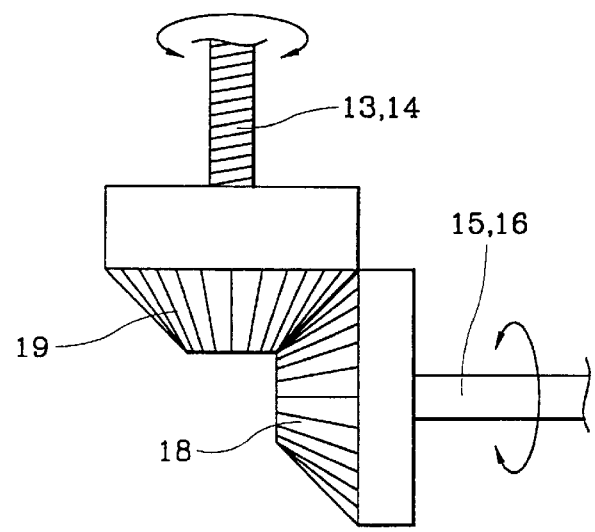
FIG. 3 is a partially expanded perspective view for illustrating a meshed state of a rotary shaft at a motor and a ball screw in FIG. 1.

The transfer means is mounted with, as illustrated in FIG. 3, a first gear 18 fixed to the rotary shaft of the first and second motors 15 and 16 and a second gear 19 meshed to the first gear 18 at a predetermined angle of bent method and fixed to one end of the first and second ball screws 13 and 14.

At this time, embodiment of the present invention utilizes the first and second gears 18 and 19 as bevel gears because the rotary shaft of the first and second motors 15 and 16 and the first and second ball screws 13 and 14 meet at right angle.

Now, operational effect of the present invention thus constructed will be described. Where the first and second motors 15 and 16 are activated to distance the receiving plate 2 from the lead tub 50 at a predetermined space and when the molten lead (Pb) is filled in the hole 51 at the cover 52 to allow the PCB substrate (P) to accommodate in the cover 52, the molten lead (Pb) is filled to a level as high as a height for soldering. When the molten lead (Pb) is filled, the pressing jig 6 is upwardly rotary to be widely distanced from the receiving plate 6. When the pressing jig 6 is upwardly rotated, the PCB substrate (P) mounted with parts in the receiving unit 1 is accommodated to reversely rotate the pressing jig 6 and to thereafter fix the PCB substrate (P).

When the PCB substrate (P) is fixed to the receiving unit 1, the first and second motors 15 and 16 are driven, where the PCB substrate (P) is sequentially operated in "↗" "—" "↘" during soldering process.

Figure 4:
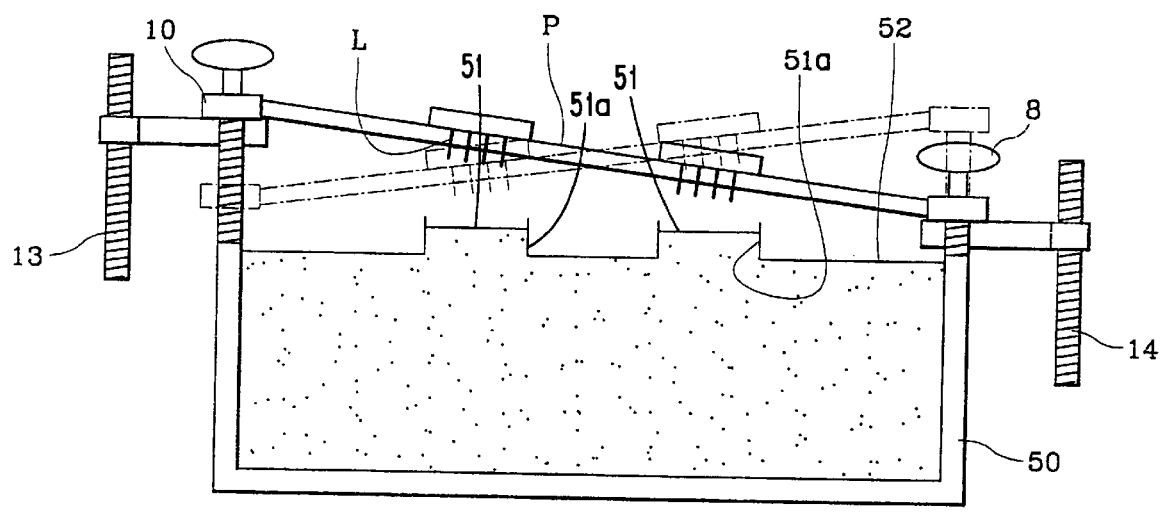
FIG. 4 is a schematic diagram for illustrating an operational process of a PCB substrate against molten lead in a soldering device according to the present invention.
Figure 5:
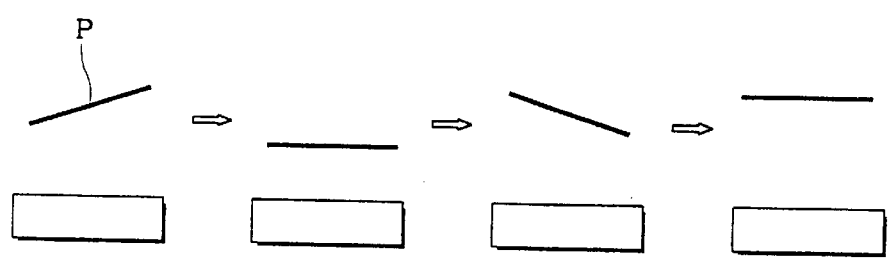
FIG. 5 is a constitutional diagram for sequentially illustrating operational process of the receiving plate in FIG. 4.
Figure 6:
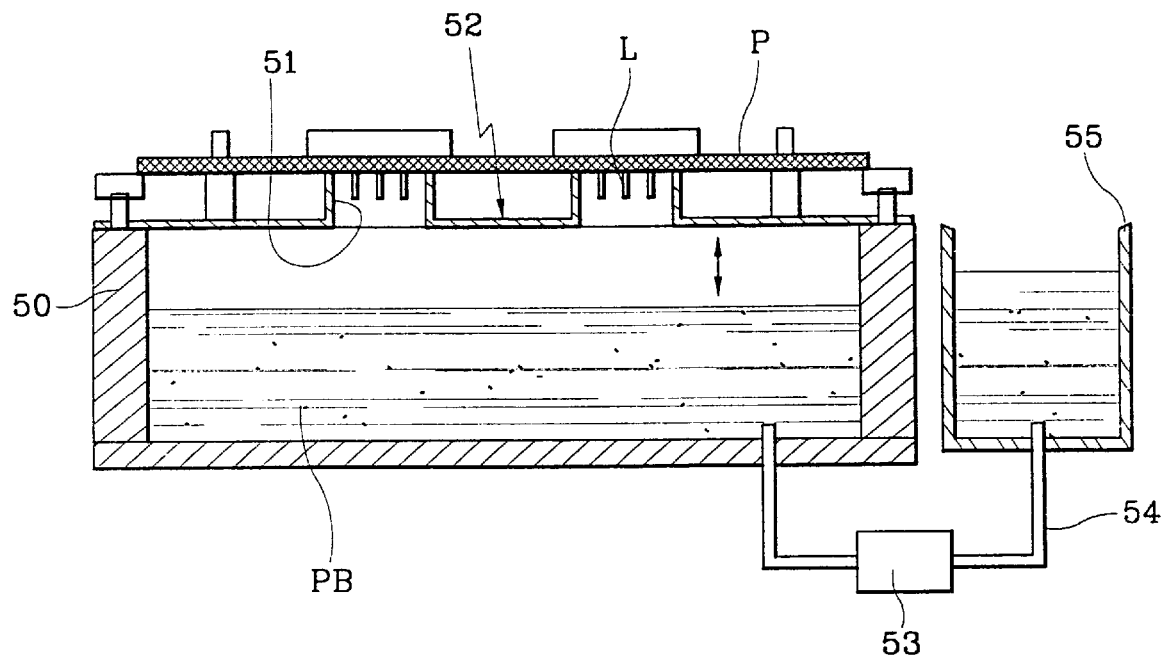
FIG. 6 is a plan for illustrating a soldering device by way of conventional dipping method.
Figure 7:
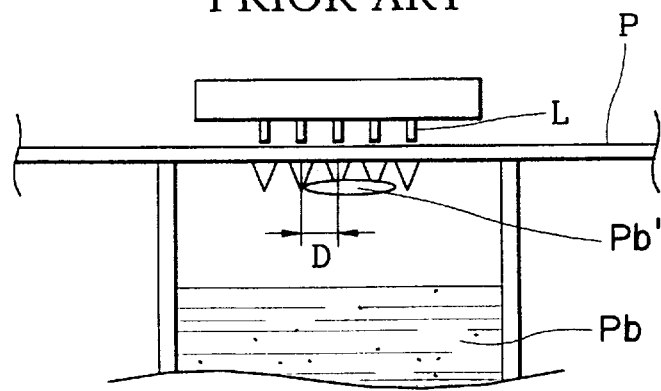
FIG. 7 is a constitutional diagram for illustrating an inferior soldered state where spaces between pins are narrow in the use of the soldering device in FIG. 6.

In other words, as illustrated in FIGS. 4 and 5, the first motor 15 is operated to descend the first ball screw 13 and the first elevation member 10 where the receiving plate 2 is elevated to a predetermined height, such that the second motor 16 is not operated.

The receiving plate 2 is positioned at a "↗" state when the first ball screw 13 and the first elevation member 10 are descended and the second ball screw 14 and the second elevation member 11 are at static state, and the PCB substrate (P) accommodated in the receiving plate 2 gradually contacts the molten lead (Pb) in a slant state.

After the PCB substrate (P) contacts the molten lead (Pb) in a slant state, the PCB substrate (P) is continuously operated by operational control of the first and second motors 15 and 16. When the molten lead (Pb) and the PCB substrate (P) are contacted in sequential order of "↗" "—" "↘" according to slant angle of the receiving plate 2 separation speed and angle of the molten lead (Pb) and the PCB substrate (P) are optimally controlled where respective leads (L) are soldered.

In other words, a plurality of leads (L) are not simultaneously contacted with or separated from the molten lead (Pb) as in the prior art, but instead respective leads (L) contact the molten lead (Pb) at slant positions thereof to thereby prevent the leads (L) from being soldered in overlapped erroneous positions.

When one PCB substrate (P) is completed in soldering, the pressing jig 6 is rotated in releasable direction and the PCB substrate (P) is detached from the receiving unit 1, another PCB substrate (P) which is next object of soldering is accommodated to the receiving unit 1 to perform continuous execution of the soldering.

Here, processing and assembling allowances between the receiving unit 1 and the PCB substrate (P) and the pressing jig (6) are optimally maintained to securely fix the PCB substrate (P) by way of the pressing jig 6, such that the PCB substrate (P) is not swung when the receiving plate 2 is slanted to thereby maintain an accurate soldering.

As apparent from the foregoing, there is an advantage in the soldering device according to the present invention in that the PCB substrate (P) is slantingly soldered in sequential order of "↗" "—" "↘" while the level of the molten lead is fixed and the PCB substrate (P) is slantingly separated, thereby preventing erroneous overlapped soldering of the PCB substrate (P).

What is claimed:

1. A soldering device comprising:

a tub containing molten lead;

a cover mounted on top of the tub, the cover including a plurality of holes, each hole surrounded by an upstanding wall extending higher than an upper edge of the tub, whereby the molten lead extends upwardly into the holes beyond the upper edge of the tub, the molten lead disposed below upper edges of the respective upstanding walls;

a receiving plate disposed above the tub and including a receiving unit for supporting a printed circuit board over the cover, to position printed circuit board parts over respective ones of the holes, to enable the printed circuit board parts to be dipped in the molten lead disposed within the holes;

fixing means for removably securing the printed circuit board on the receiving unit; and elevation means arranged to raise and lower respective ends of the receiving plate simultaneously and relative to one another while the receiving unit is situated over the cover, whereby the receiving unit is selectively movable to a horizontal state and to inclined states inclined relative to horizontal.

2. The device as defined in claim 1 wherein the elevation means comprises screw-threaded rods connected to respective ends of the receiving plate, each rod operable to raise and lower its respective end of the receiving plate in response to being rotated.

3. The device as defined in claim 1, wherein the fixing means comprises:

hinges disposed at both ends of the receiving unit and formed opposite to rotary holes; and a pressing jig formed with rotary shafts at both ends thereof to be inserted into rotary holes for rotating movement and formed with a rotary shaft disposed in a little bit biased location at each side thereof.

4. The device as defined in claim 1, wherein the elevation means comprises:

elevation holes, each hole being formed at opposite side of the receiving plate;

first and second elevation rods inserted into the elevation holes for elevation and each formed with smaller minor diameter than that of the elevation hole and each spaced at a predetermined distance;

first and second elevation members fixed at one side of the first and second elevation rods and supporting the receiving plate from the bottom thereof; and driving means disposed to vertically move the first and second elevation members.

5. The device as defined in claim 4, wherein the driving means comprises:

first and second ball screws screwed to the first and second elevation members and having both ends thereof supported by rotating support for rotating movement;

transfer means for transferring power of first and second motors to thereby rotate the first and second ball screws; and a control unit for controlling frequency and rotary directions of the first and second motors.

6. The device as defined in claim 5, whereon the transfer means comprises:

a first gear fixed to a rotary shaft of the first and second motors; and a second gear meshed to the first gear and fixed to one end of the first and second ball screws.

* * * * *